United States Patent
Hirooka

(10) Patent No.: US 7,372,289 B2
(45) Date of Patent: May 13, 2008

(54) SEMICONDUCTOR INTEGRATED CIRCUIT DEVICE AND POWER SUPPLY VOLTAGE MONITOR SYSTEM EMPLOYING IT

(75) Inventor: Kenichi Hirooka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 171 days.

(21) Appl. No.: 10/569,043

(22) PCT Filed: Aug. 19, 2004

(86) PCT No.: PCT/JP2004/011898

§ 371 (c)(1),
(2), (4) Date: Feb. 21, 2006

(87) PCT Pub. No.: WO2005/020437

PCT Pub. Date: Mar. 3, 2005

(65) Prior Publication Data

US 2006/0214650 A1 Sep. 28, 2006

(30) Foreign Application Priority Data

Aug. 22, 2003 (JP) ............................. 2003-298285

(51) Int. Cl.
G01R 31/36 (2006.01)
G01R 31/02 (2006.01)
(52) U.S. Cl. ..................................... 324/771; 324/764
(58) Field of Classification Search .................... None
See application file for complete search history.

(56) References Cited

U.S. PATENT DOCUMENTS

| | | | | |
|---|---|---|---|---|
| 6,043,702 A | * | 3/2000 | Singh | .......................... 327/534 |
| 6,118,319 A | * | 9/2000 | Yamada et al. | ............. 327/291 |
| 6,150,863 A | * | 11/2000 | Conn et al. | .................. 327/270 |
| 6,195,305 B1 | * | 2/2001 | Fujisawa et al. | ............ 365/226 |
| 6,274,895 B1 | * | 8/2001 | Fujii et al. | ................... 257/207 |
| 6,934,210 B2 | * | 8/2005 | Akiba et al. | ................. 365/222 |
| 7,205,851 B2 | * | 4/2007 | Sumita | ......................... 327/12 |
| 7,274,261 B2 | * | 9/2007 | Sumita | ......................... 331/16 |
| 2006/0158265 A1 | * | 7/2006 | Sumita | ......................... 331/16 |
| 2007/0069823 A1 | * | 3/2007 | Sumita | ......................... 331/16 |

FOREIGN PATENT DOCUMENTS

| | | |
|---|---|---|
| JP | 54-116131 | 9/1979 |
| JP | 2-201618 | 8/1990 |

* cited by examiner

Primary Examiner—Jermele Hollington
(74) Attorney, Agent, or Firm—Fish & Richardson P.C.

(57) ABSTRACT

A semiconductor integrated circuit device, i.e. a reset IC(1), includes: a detection circuit (4) for detecting whether an input voltage (Vin) has risen or dropped by comparing the input voltage (Vin) with a reference voltage; a delay circuit (8) for delaying a start-up voltage detection signal from the detection circuit (4) by charging a capacitor (C) connected thereto via a connection terminal (CT), and discharging the capacitor (C) by receiving an output signal (Vout) of a first voltage; a retention circuit (9) for retaining a start-up voltage detection signal delayed by the delay circuit (8); and a driver (10) for generating an output signal (Vout) that becomes a first voltage by a start-up voltage detection signal retained by the retention circuit (9), and generating an output signal (Vout) that becomes a second voltage by a voltage drop detection signal from the detection circuit (4).

9 Claims, 8 Drawing Sheets

US 7,372,289 B2

SEMICONDUCTOR INTEGRATED CIRCUIT DEVICE AND POWER SUPPLY VOLTAGE MONITOR SYSTEM EMPLOYING IT

This application is a 371 of PCT/JP04/11898 filed on Aug 22, 2003.

TECHNICAL FIELD

The present invention relates to a semiconductor integrated circuit device incorporated in an electronic appliance provided with a control portion such as a microcomputer, a DSP (digital signal processor), or a logic circuit so as to monitor a power supply voltage to be fed to the electronic appliance and detect a set voltage, and a power supply voltage monitor system employing the same. More particularly, the present invention relates to a semiconductor integrated circuit device provided with a delay circuit that delays an output signal when the power supply voltage is detected exceeding the set voltage, and a power supply voltage monitor system employing the same.

BACKGROUND ART

To ensure stable operation, some electronic appliances provided with a control portion such as a microcomputer, a DSP, or a logic circuit put the control portion into an unreset state and make it operate when a power supply voltage to be fed to the electronic appliance becomes a predetermined voltage or higher. On the other hand, before the power supply voltage becomes so low that the control portion or the like cannot operate, they sometimes need to perform predetermined processing such as data backup required when power supply is down. Therefore, many electronic appliances incorporate a voltage detection device that monitors a power supply voltage to be fed so as to detect that it has become a predetermined voltage. Among those voltage detection devices, there are some which are capable of delaying an output signal by a predetermined delay time after detecting that the power supply voltage has become a predetermined voltage or higher. The reason is as follows. In general, the power supply voltage to be fed continues to rise even after it has become a predetermined voltage or higher, and then becomes stable. Therefore, making the control portion of the electronic appliance operate with a delay after detecting that the power supply voltage has become a predetermined voltage is expected to offer even more stable operation of the electronic appliance.

FIG. 7 is a circuit diagram showing a conventional reset IC (semiconductor integrated circuit device) that serves as the voltage detection device described above. In FIG. 7, reference numeral 1a denotes a reset IC. The reset IC 1a includes, as its external terminals, an input terminal 2 that receives an input voltage Vin, an output terminal 3 that outputs an output signal (monitor signal) Vout indicating whether the input voltage Vin is higher or lower than a predetermined voltage, and a connection terminal CT electrically connected to one end of a capacitor C that is fitted outside the reset IC 1a. Note that the other end of the capacitor C is connected to a ground GND. In general, the input voltage Vin is a power supply voltage to be fed to an electronic appliance in which the reset IC 1a is incorporated, and the output signal Vout outputted from the output terminal 3 permits a control portion such as a microcomputer, a DSP, or a logic circuit provided inside the electronic appliance to be switched between a reset state and a non-reset state.

Inside the reset IC 1a shown in FIG. 7, a voltage division circuit 5 is connected to the input terminal 2, and an output from the voltage division circuit 5 is fed to the inverting input terminal (−) of a comparator (comparison circuit) 11. On the other hand, a reference voltage Vref from a reference voltage generation circuit 7 is fed to the non-inverting input terminal (+) of the comparator 11. The output terminal of the comparator 11 is connected to the gate of an N-channel MOS transistor (switch) 12. The drain of the MOS transistor 12 is connected to an electric power supply Vdd via a charging resistance R, and is connected to the input terminal of an amplifier 13 whose threshold voltage exhibits hysteresis. The source of the MOS transistor 12 is connected to a ground GND, and the output terminal of the amplifier 13 is connected to the output terminal 3 via buffer inverters 14 and 15.

An operation of the reset IC 1a configured as described above will be described with reference to FIG. 8. FIG. 8 is a waveform diagram showing voltage waveforms of the external terminals of the reset IC 1a, that is, from top to bottom, a voltage waveform of an input voltage Vin to be applied to the input terminal 2, a voltage waveform of a terminal voltage Vct of the connection terminal CT, and a voltage waveform of an output signal Vout from the output terminal 3. In each of the voltage waveforms, the vertical axis represents voltage, and the horizontal axis represents time. On the other hand, $V_{DET}$ shown in FIG. 8 denotes a reset detection voltage, and $V_{DET}+\Delta V_{DET}$ denotes a non-reset voltage. The reset detection voltage is a voltage at which the output signal Vout is switched from high level (hereinafter referred to as "H") to low level (hereinafter referred to as "L"), and the non-reset voltage is a voltage at which the output signal Vout is switched from "L" to "H". Here, $\Delta V_{DET}$ is the difference between the reset detection voltage and the non-reset voltage, and is referred to as a hysteresis voltage. By giving a hysteresis voltage, it is possible to prevent malfunctioning that could be caused by noise or the like (within the hysteresis voltage) of the input voltage Vin. It is to be noted that the voltage division circuit 5 shown in FIG. 7 can be composed of, for example, a voltage dividing resistance that divides the input voltage Vin with a predetermined voltage ratio and a switch that is switched on/off according to an output of the comparator 11 so as to vary the voltage dividing ratio, thereby giving the hysteresis voltage $\Delta V_{DET}$.

First, an operation performed when the input voltage Vin is swept up will be described. As shown in FIG. 8, at time $T_0$, the input voltage Vin starts to rise gradually, that is, to sweep up. This input voltage Vin is divided by the voltage division circuit 5 shown in FIG. 7, and the divided voltage from the voltage division circuit 5 is fed to the inverting input terminal (−) of the comparator 11. The comparator 11 compares the divided voltage with a reference voltage Vref from the reference voltage generation circuit 7. When the divided voltage is lower than the reference voltage Vref, that is, when the input voltage Vin is lower than the non-reset voltage $V_{DET}+\Delta V_{DET}$, the output of the comparator 11 turns to "H", whereby the MOS transistor 12 turns on, and the potential of the drain of the MOS transistor 12 becomes equal to the potential of the ground GND. Therefore, at this time, the capacitor C is in a discharged state, and the terminal voltage Vct of the connection terminal CT is 0 V. On the other hand, the output signal Vout takes "L" via the amplifier 13 and the inverters 14 and 15.

At time $T_1$ at which the input voltage Vin reaches the non-reset voltage $V_{DET}+\Delta V_{DET}$, the divided voltage from the voltage division circuit 5 exceeds the reference voltage Vref. As a result, the output of the comparator 11 turns to "L", the MOS transistor 12 turns off, and thus the capacitor C starts to be charged with a charging current flowing from the electric power supply Vdd and being limited by the charging resistance R. Accordingly, the terminal voltage Vct of the connection terminal CT rises according to a time constant determined by a resistance value of the charging resistance R and the capacitance of the capacitor C.

At time $T_2$ at which the terminal voltage Vct exceeds a threshold voltage Vth (on) of the amplifier 13, the output of the amplifier 13 is inverted from "L" to "H", and thus the output signal Vout is switched from "L" to "H". When the output signal Vout takes "H", the electronic appliance in which the reset IC 1a is incorporated is unreset, and shifts into an operating state. Here, the time difference between time $T_1$ and time $T_2$ corresponds to a delay time $T_{PLH}$ with which the output signal Vout is switched from "L" to "H" when the input voltage Vin has risen, and with which the output signal Vout is shifted from "L" to "H" so as to unreset the electronic appliance and make it operate after the input voltage Vin becomes stable. This delay time $T_{PLH}$ can be set at an arbitrary time by replacing the capacitor C with a capacitor of different capacitance.

Next, an operation performed when the input voltage Vin is swept down will be described. As shown in FIG. 8, at time $T_3$, the input voltage Vin starts to decrease gradually, that is, to sweep down. When the input voltage Vin is higher than the reset detection voltage $V_{DET}$, the capacitor C is in a charged state, the potential of the terminal voltage Vct of the connection terminal CT becomes equal to the potential of the electric power supply Vdd, and the output signal Vout takes "H". When the input voltage Vin is swept down from that state, and becomes lower than the reset detection voltage $V_{DET}$ at time $T_4$, the divided voltage from the voltage division circuit 5 becomes lower than the reference voltage Vref. As a result, the output of the comparator 11 turns to "H", the MOS transistor 12 turns on, and thus the capacitor C is discharged via the MOS transistor 12. Accordingly, the terminal voltage Vct of the connection terminal CT decreases according to a time constant determined by the on resistance of the MOS transistor 12 and the capacitance of the capacitor C.

At time $T_5$ at which the terminal voltage Vct becomes lower than a threshold voltage Vth (off) of the amplifier 13, the output of the amplifier 13 is inverted from "H" to "L", and thus the output signal Vout is switched from "H" to "L". When the output signal Vout takes "L", the electronic appliance in which the reset IC 1a is incorporated shifts into a reset state. This helps prevent the electronic appliance from malfunctioning or running out of control by stopping the operation thereof before such problems occur due to reduction in power supply fed to the electronic appliance. Moreover, it is possible to make the electronic appliance perform processing such as data backup required when power supply is down. Here, the time difference between time $T_4$ and time $T_5$ corresponds to a delay time $T_{PHL}$ with which the output signal Vout is switched from "H" to "L" when the input voltage Vin has dropped. When the capacitance of the capacitor C is made larger so as to make longer the delay time $T_{PLH}$ accompanying the rising of the input voltage Vin, the delay time $T_{PHL}$ accompanying the dropping of the input voltage Vin also becomes longer.

There has been proposed a reset control circuit in which two reset control circuit portions having different delay times are arranged in series or parallel, each reset control circuit portion including voltage detection means for detecting whether a voltage has risen or dropped by comparing a power supply voltage with a predetermined voltage value, signal delay means for delaying a detection signal by a predetermined delay time when the voltage detection means detects that the voltage has risen, and a reset output portion that generates a reset control signal for performing reset control of a circuit based on the detection signal delayed by the signal delay means (see, for example, Patent Publication 1).

Patent Publication 1: Japanese Patent Application Laid-Open No. H5-206811

DISCLOSURE OF THE INVENTION

Problems to be Solved by the Invention

Preferably, a voltage detection device that is incorporated in an electronic appliance provided with a control portion such as a microcomputer, a DSP, or a logic circuit so as to monitor a power supply voltage to be fed to this electronic appliance and detect a set voltage switches, when it is detected that the power supply voltage has risen, an output signal after the lapse of a predetermined delay time so as to make the electronic appliance operate on a stable power supply voltage, and switches, immediately when it is detected that the power supply voltage has dropped, the output signal so as to prevent the electronic appliance from running out of control or malfunctioning.

However, in the conventional reset IC 1a shown in FIG. 7, when the capacitance of the capacitor C is made larger so as to make longer the delay time $T_{PLH}$ (see FIG. 8) with which the output signal Vout is switched when the input voltage Vin has risen, the delay time $T_{PHL}$ (see FIG. 8) with which the output signal Vout is switched when the input voltage Vin has dropped also becomes longer. The problem here is that the longer delay time $T_{PHL}$ causes the following undesirable phenomenon. When the input voltage Vin drops within a short period of time, the output signal Vout is switched after the input voltage Vin drops to a voltage at which the electronic appliance in which the reset IC 1a is incorporated cannot operate normally. This makes the reset IC 1a worthless. On the other hand, when the input voltage Vin drops or increases within a short period of time due to instantaneous electric power interruptions or the like, that is, when the frequency of the input voltage varies over short intervals, the output signal Vout is not switched due to the delay time $T_{PHL}$ resulting from the discharge of the capacitor C, making it impossible to detect the drop in the input voltage Vin.

On the other hand, according to the conventional technique described in Patent Publication 1, by using two reset control circuit portions having different delay times, it is possible to make a reset control circuit portion having a longer delay time output a reset control signal when the power supply voltage has risen, and make a reset control circuit portion having a shorter delay time output a reset control signal when the power supply voltage has dropped. Also in this case, however, when the frequency of the power supply voltage varies over short intervals, the output signal cannot follow it, because the delay time of the output signal accompanying the voltage dropping is never reduced to zero. Moreover, there is a need to use two similar reset control circuit portions. This increases the number of parts, making the device larger.

In view of the problems described above, it is an object of the present invention to provide a semiconductor integrated circuit device and a power supply voltage monitor system employing the same that offer improved response to the frequency variations in an input voltage by switching the voltage of a monitor signal to be outputted after delaying it by a predetermined delay time when it is detected that the input voltage has risen, and switching the voltage of the monitor signal immediately when it is detected that the input voltage has dropped.

Means for Solving the Problem

To achieve the above object, according to one aspect of the present invention, a semiconductor integrated circuit device that monitors an input voltage by comparing the input voltage with a predetermined voltage, and outputs a voltage representing the result of comparison is provided with: a detection circuit that detects that the input voltage has risen by comparing the input voltage with a reference voltage, and outputs a detection signal of the input voltage; a delay circuit that delays the detection signal from the detection circuit by a time constant adjustment method; and a driver that inhibits the output of the detection signal immediately when the detection circuit detects that the input voltage has dropped. In this semiconductor integrated circuit device, an output voltage generated by the driver is outputted as a monitor signal.

With this configuration, it is possible to switch the voltage of the monitor signal to be outputted after delaying it by a time constant adjustment method when the input voltage has risen, and switch the voltage of the monitor signal to be outputted immediately when the input voltage has dropped.

Preferably, for example, there are provided: a connection terminal to which a capacitor is connected; and a retention circuit that receives an output of the detection circuit and an output of the delay circuit, and that retains the detection signal delayed by the delay circuit. The delay circuit may delay the detection signal from the detection circuit by charging the capacitor via the connection terminal, and discharge the capacitor by outputting the detection signal, and the driver may generate a first voltage according to the detection signal retained by the retention circuit.

With this configuration, it is possible to switch the monitor signal to be outputted from a second voltage to a first voltage by delaying it by a delay time corresponding to the capacitance of the capacitor when the input voltage has risen, and switch the monitor signal to be outputted from a first voltage to a second voltage immediately when the input voltage has dropped. Therefore, it is possible to improve response of the monitor signal to frequency variations in the input voltage.

Preferably, for example, the delay circuit includes a charging resistance connected between a direct-current power supply and the connection terminal, a first switch connected between the connection terminal and a ground, a logic gate that turns off the first switch when the detection signal from the detection circuit and the monitor signal of a second voltage are fed thereto, and an amplifier that outputs a high level or low level signal according to the voltage of the connection terminal.

With this configuration, it is possible to delay the detection signal from the detection circuit, by charging the capacitor with a charging current flowing from the direct-current power supply and being limited by the charging resistance by making the logic gate turn off the first switch when the input voltage has risen, by a time taken by the voltage of the connection terminal that rises as the capacitor is charged to reach a voltage at which the amplifier outputs a high level signal, and it is possible to discharge the capacitor by making the logic gate turn on the first switch when the monitor signal is a first voltage. Moreover, when the monitor signal is a first voltage, the logic gate turns on the first switch, making the input of the delay circuit have a low impedance. This makes it possible to prevent the delay circuit from malfunctioning due to noise or the like.

Preferably, for example, the delay circuit includes a second switch connected between the direct-current power supply and the charging resistance, the second switch performing a reverse on/off operation of the first switch. This makes it possible to charge the capacitor by making the second switch turn on when the first switch turns off, and discharge the capacitor when the first switch turns on while preventing, by turning off the second switch, a current from unnecessarily flowing from the direct-current power supply to the ground through the charging resistance and the first switch that has turned on. Moreover, when the first switch is turned on and the capacitor is in a discharged state, the second switch turns off, and is thus cut off from the direct-current power supply. This eliminates the possibility of intrusion of noise from the direct-current power supply. Note that the input voltage may be used in place of the direct-current power supply as an electric power supply for charging the capacitor. Moreover, by using MOS transistors as the first and second switches, it is possible to reduce the electric power consumption, and minimize the electric power loss caused by the charging and discharging current to the capacitor.

Preferably, for example, the retention circuit is a D latch that is set when the detection signal delayed by the delay circuit is fed thereto as a clock input, and is reset when the detection circuit detects that the input voltage has dropped. This makes it possible to realize a retention circuit that retains a detection signal delayed by the delay circuit when the input voltage has risen until the input voltage has dropped.

Preferably, for example, the retention circuit is a switch circuit that connects and disconnects the delay circuit to and from the driver according to an output of the detection circuit and the monitor signal. This makes it possible to realize a retention circuit that retains a detection signal delayed by the delay circuit when the input voltage has risen until the input voltage has dropped, and then feeds the retained detection signal to the driver. Moreover, this makes it possible to simplify the retention circuit, making it possible to make the semiconductor integrated circuit device smaller in footprint and compact.

Preferably, for example, the switch circuit consists of a third switch that turns on when the monitor signal is a first voltage and a fourth switch that turns on when the detection signal from the detection circuit is fed thereto, the third and fourth switches being connected in parallel between the delay circuit and the driver. This makes it possible to realize a retention circuit, despite having a simple configuration, that retains a detection signal delayed by the delay circuit when the input voltage has risen until the input voltage has dropped. Note that, by using MOS transistors as the third and fourth switches, it is possible to achieve a switch circuit that operates with less electric power consumption and that can connect between the delay circuit and the driver with a low resistance.

According to another aspect of the present invention, a power supply voltage monitor system provided with the semiconductor integrated circuit device and a capacitor connected to a connection terminal of the semiconductor integrated circuit device makes the semiconductor integrated circuit device monitor a power supply voltage to be fed to an electronic appliance, and switch a control portion of the electronic appliance between a reset state and a non-reset state according to a monitor signal outputted from the semiconductor integrated circuit device.

With this configuration, it is possible to make the electronic appliance operate on a stable power supply voltage by switching the control portion of the electronic appliance into a non-reset state with a predetermined delay time when the power supply voltage has risen, and prevent the control portion of the electronic appliance from running out of control or malfunctioning by switching it into a reset state immediately when the power supply voltage has dropped below a predetermined voltage. Moreover, it is possible to realize a power supply voltage monitor system that offers improved response to the frequency variations in the power supply voltage.

Effect of the Invention

According to the present invention, in a semiconductor integrated circuit device that monitors an input voltage by comparing the input voltage with a predetermined voltage, and outputs a voltage representing the result of comparison, and that is provided with: a detection circuit that detects that the input voltage has risen by comparing the input voltage with a reference voltage, and outputs a detection signal of the input voltage; a delay circuit that delays the detection signal from the detection circuit by a time constant adjustment method; and a driver that inhibits the output of the detection signal immediately when the detection circuit detects that the input voltage has dropped, an output voltage generated by the driver is outputted as a monitor signal. Therefore, it is possible to switch the voltage of the monitor signal to be outputted after delaying it by a time constant adjustment method when the input voltage has risen, and switch the voltage of the monitor signal to be outputted immediately when the input voltage has dropped. This makes it possible to realize a semiconductor integrated circuit device that offers improved response to the frequency variations in the input voltage, and a power supply voltage monitor system employing the same.

Figure 1:
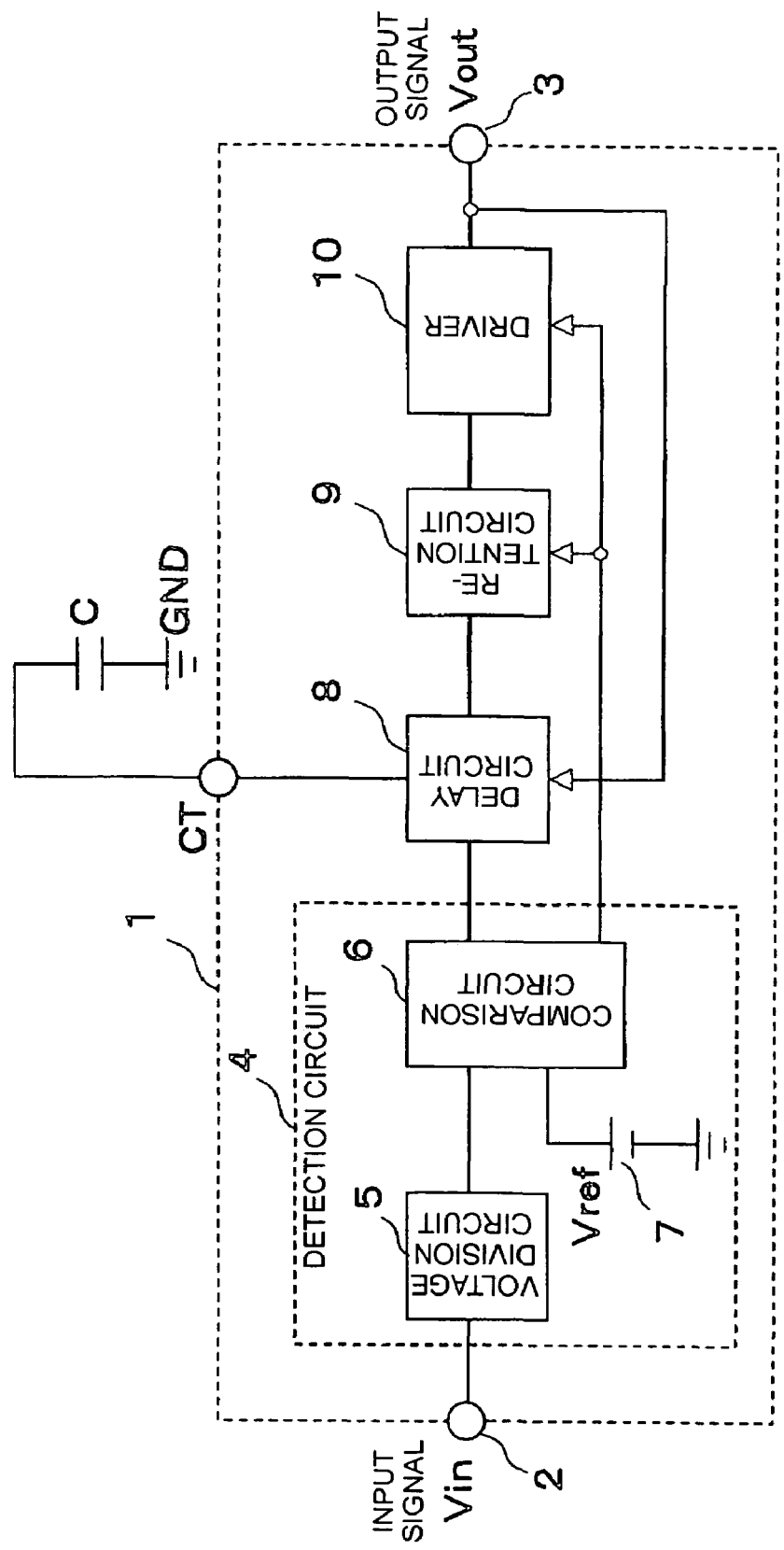
FIG. 1 A block diagram showing the electrical configuration of the reset IC of one embodiment of the present invention.

LIST OF REFERENCE SYMBOLS 1 reset IC (semiconductor integrated circuit device)
2 input terminal
3 output terminal
4 detection circuit
5 voltage division circuit
6 comparison circuit
7 reference voltage generation circuit
8 delay circuit
9 retention circuit
10 driver
11 comparator (comparison circuit)
12, 29, 41, 42 MOS transistor (switch)
13 amplifier
14 to 18, 20, 25 to 28, 33 inverter
19 NAND gate (logic gate)
21 NAND gate
22 D latch (retention circuit)
23 NAND gate (driver)
24 inverter (driver)
30 switch circuit (retention circuit)
30a, 30b terminal
30c, 30d control terminal
31 constant-current circuit (driver)
32 MOS transistor (driver)
60 electronic appliance
61 power supply terminal
62 ground (GND) terminal
63 microcomputer (control portion)
64 reset (RST) terminal
C capacitor
CT connection terminal
R charging resistance

BEST MODE FOR CARRYING OUT THE INVENTION

Figure 7:
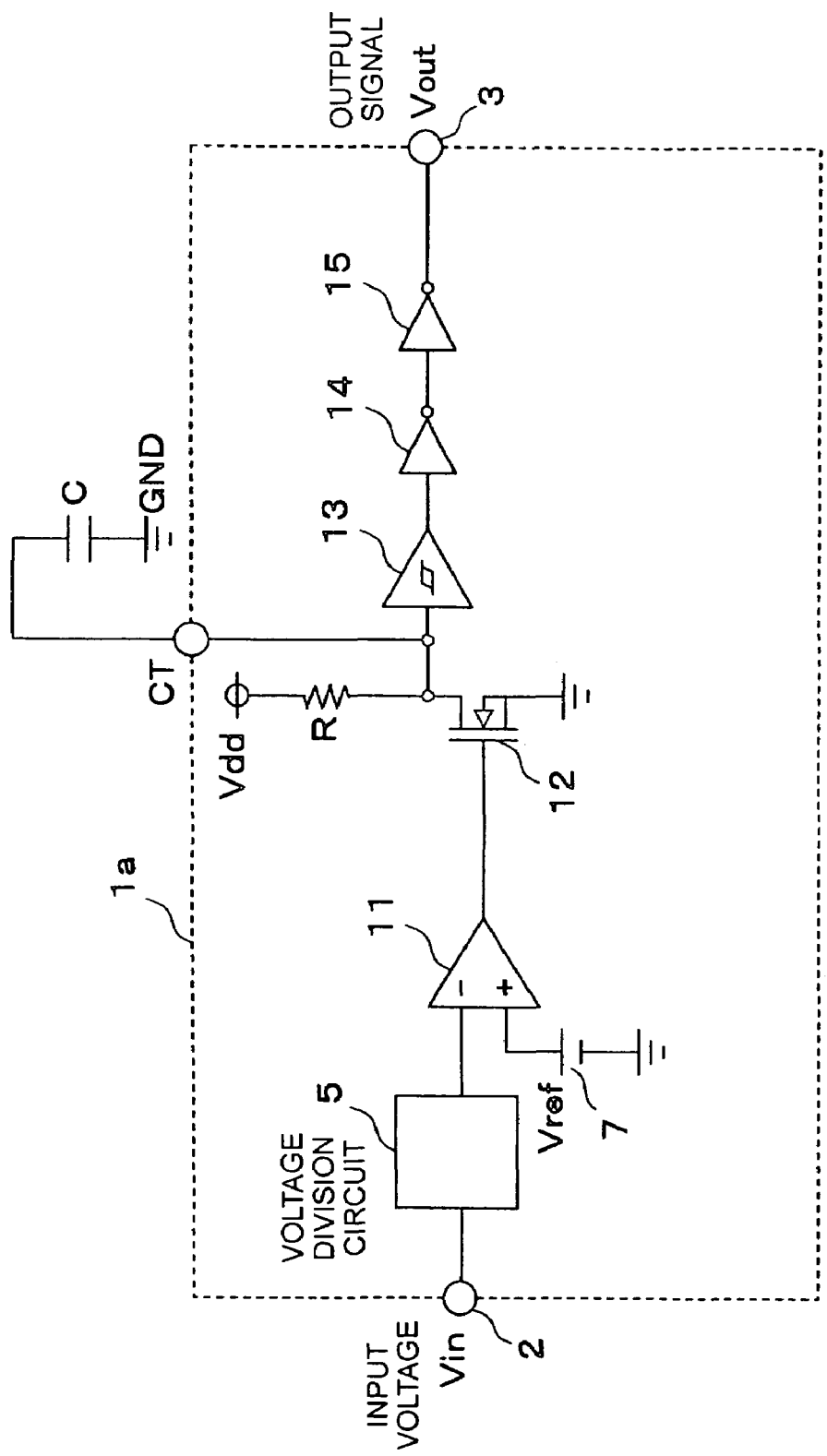
FIG. 7 A circuit diagram showing the conventional reset IC.

Hereinafter, an embodiment of the present invention will be described with the accompanying drawings. For convenience's sake, such components as are found also in the conventional example of FIG. 7 will be identified with the same reference numerals and characters. FIG. 1 is a block diagram showing the electrical configuration of the reset IC (semiconductor integrated circuit device) of one embodiment of the present invention. In FIG. 1, reference numeral 1 denotes a reset IC, and the reset IC 1 includes, as its external terminals, an input terminal 2 that receives an input voltage Vin, an output terminal 3 that outputs an output signal (monitor signal) Vout indicating whether the input voltage Vin is higher or lower than a predetermined voltage, and a connection terminal CT electrically connected to one end of a capacitor C that is fitted outside the reset IC 1. Note that the other end of the capacitor C is connected to a ground GND. In general, this input voltage Vin is a power supply voltage to be fed to an electronic appliance in which the reset IC 1 is incorporated, and the output signal Vout outputted from the output terminal 3 permits a control portion such as a microcomputer, a DSP, or a logic circuit provided inside the electronic appliance to be switched between a reset state and a non-reset state.

Inside the reset IC 1 shown in FIG. 1, there are provided a detection circuit 4, a delay circuit 8, a retention circuit 9, and a driver 10. The detection circuit 4 is composed of a voltage division circuit 5, a comparison circuit 6, and a reference voltage generation circuit 7. The input voltage Vin inputted from the input terminal 2 is fed to the voltage division circuit 5, and the divided voltage from the voltage division circuit 5 is compared by the comparison circuit 6 with a reference voltage Vref from the reference voltage generation circuit 7. When the divided voltage becomes higher than the reference voltage Vref, the delay circuit 8 delays a start-up voltage detection signal (detection signal of the input voltage) outputted from the comparison circuit 6 by a predetermined delay time, and then feeds it to the retention circuit 9. The above-described delay operation of the delay circuit 8 is performed by charging the capacitor C connected thereto via the connection terminal CT. Note that the voltage division circuit 5 may be provided outside the reset IC 1.

When fed with the start-up voltage detection signal from the delay circuit 8, the retention circuit 9 retains this start-up voltage detection signal, and controls the driver 10 so that the output signal Vout from the driver 10 takes "H" while it retains the start-up voltage detection signal. This output signal Vout is to be inputted to the delay circuit 8, and the delay circuit 8 discharges the capacitor C when the output signal Vout turns to "H". At this time, when the capacitor C is discharged, the delay circuit 8 stops outputting the start-up voltage detection signal. Even then, since the retention circuit 9 already retains the start-up voltage detection signal and controls the driver 10 so that the output signal Vout from the driver 10 takes "H", the output signal Vout remains "H". On the other hand, when a voltage drop detection signal that is outputted from the comparison circuit 6 when the divided voltage becomes lower than the reference voltage Vref is fed to the retention circuit 9, the retention circuit 9 stops retaining the start-up voltage detection signal. This voltage drop detection signal is also fed to the driver 10, whereby the driver 10 switches the output signal Vout from "H" to "L".

The reset IC 1 shown in FIG. 1 configured as described above switches the output signal Vout from "L" to "H" after delaying it by a delay time corresponding to the capacitance of the capacitor C when the input voltage Vin has risen, whereas it switches the output signal Vout from "H" to "L" immediately when the input voltage Vin has dropped. Therefore, this reset IC 1 is permitted to monitor a power supply voltage to be fed to the electronic appliance in which the reset IC 1 is incorporated, and switch, by using the output signal Vout of the reset IC 1, the control portion such as a microcomputer, a DSP, or a logic circuit provided inside the electronic appliance between a reset state and a non-reset state. Specifically, when the power supply voltage to be fed to the electronic appliance rises, the control portion is put into a non-reset state after a delay time has elapsed after the power supply voltage became higher than a predetermined voltage; whereas, when the power supply voltage decreases, the control portion is put into a reset state immediately when the power supply voltage becomes lower than a predetermined voltage. This makes it possible to prevent the electronic appliance from running out of control or malfunctioning.

Moreover, even when the frequency of the power supply voltage varies over short intervals due to instantaneous electric power interruptions or the like, it is possible to switch the output signal Vout from "H" to "L" immediately when the power supply voltage becomes lower than a predetermined voltage, making it possible to immediately switch the control portion to a reset state. Specifically, it is possible to achieve a reset IC that offers an output signal with improved response to the frequency variations in the power supply voltage.

Figure 2:
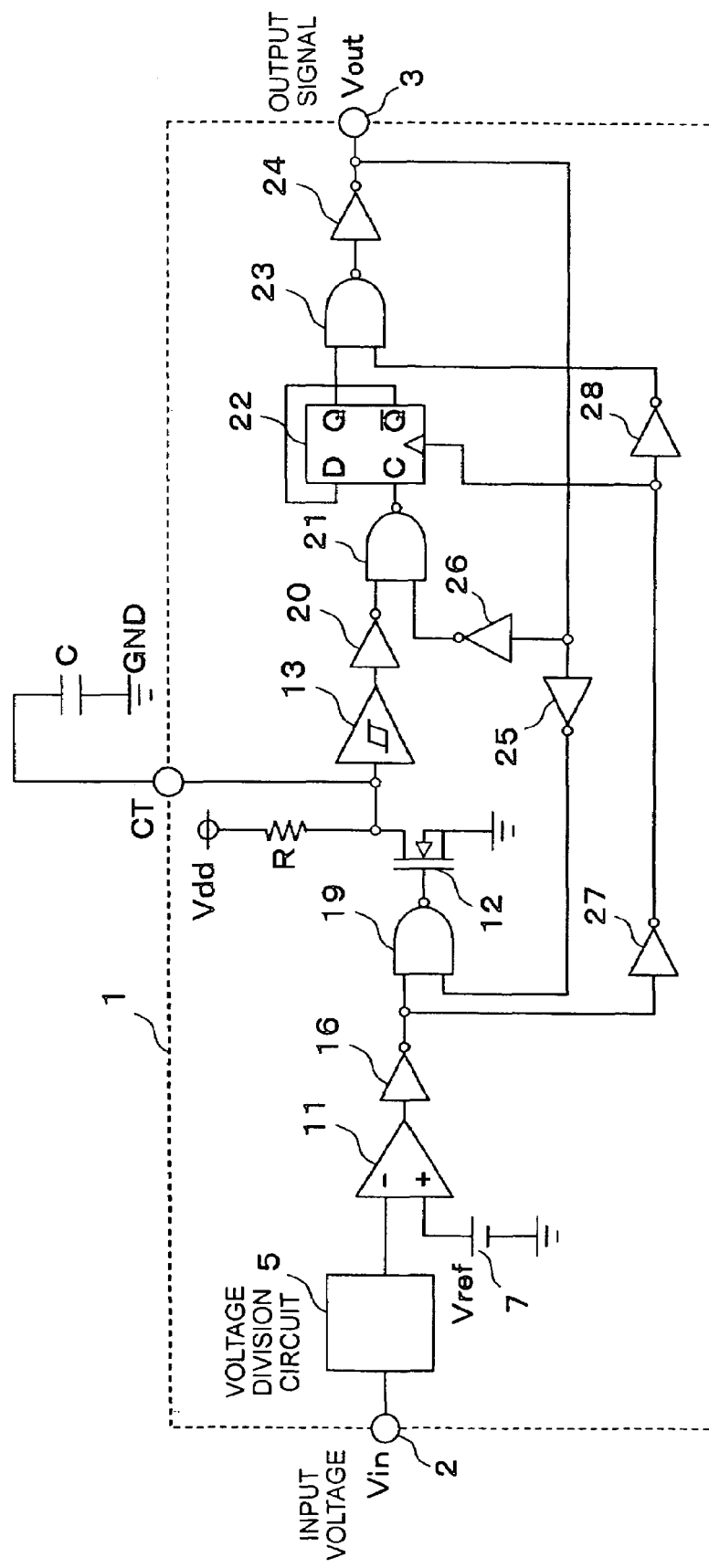
FIG. 2 A circuit diagram showing the specific circuitry of the reset IC shown in FIG. 1.

FIG. 2 is a circuit diagram showing the specific circuitry of the reset IC 1 shown in FIG. 1. The external terminals of the reset IC 1 shown in FIG. 2 are identical to those of the reset IC 1 shown in FIG. 1, and therefore description thereof will not be repeated. Inside the reset IC 1 shown in FIG. 2, the voltage division circuit 5 is connected to the input terminal 2, and the output of the voltage division circuit 5 is fed to the inverting input terminal (−) of the comparator (comparison circuit) 11. On the other hand, a reference voltage Vref from the reference voltage generation circuit 7 is fed to the non-inverting input terminal (+) of the comparator 11. The output terminal of the comparator 11 is connected to one of the two input terminals of a NAND gate (logic gate) 19 via an inverter 16.

The output terminal of the NAND gate 19 is connected to the gate of an N-channel MOS transistor (switch) 12, and the drain of the MOS transistor 12 is connected to an electric power supply Vdd via a charging resistance R, and is connected to the input terminal of the amplifier 13 whose threshold voltage exhibits hysteresis and to the connection terminal CT. The source of the MOS transistor 12 is connected to a ground GND, and the output terminal of the amplifier 13 is connected to one of the two input terminals of a NAND gate 21 via the inverter 20.

The output terminal of the NAND gate 21 is connected to a clock input terminal (C) of a D latch (retention circuit) 22, and an output terminal (Q) of the D latch 22 is connected to one of the two input terminals of a NAND gate (driver) 23. An inverting output terminal and a data input terminal (D) of the D latch 22 are connected together. The output terminal of the NAND gate 23 is connected to the output terminal 3 via an inverter (driver) 24, and the output terminal 3 is connected to the other input terminal of the NAND gate 19 via an inverter 25, and is connected to the other input terminal of the NAND gate 21 via an inverter 26. The output terminal of the inverter 16 is connected to a reset input terminal of the D latch 22 via an inverter 27, and is further connected to the other input terminal of the NAND gate 23 via an inverter 28.

Figure 5:
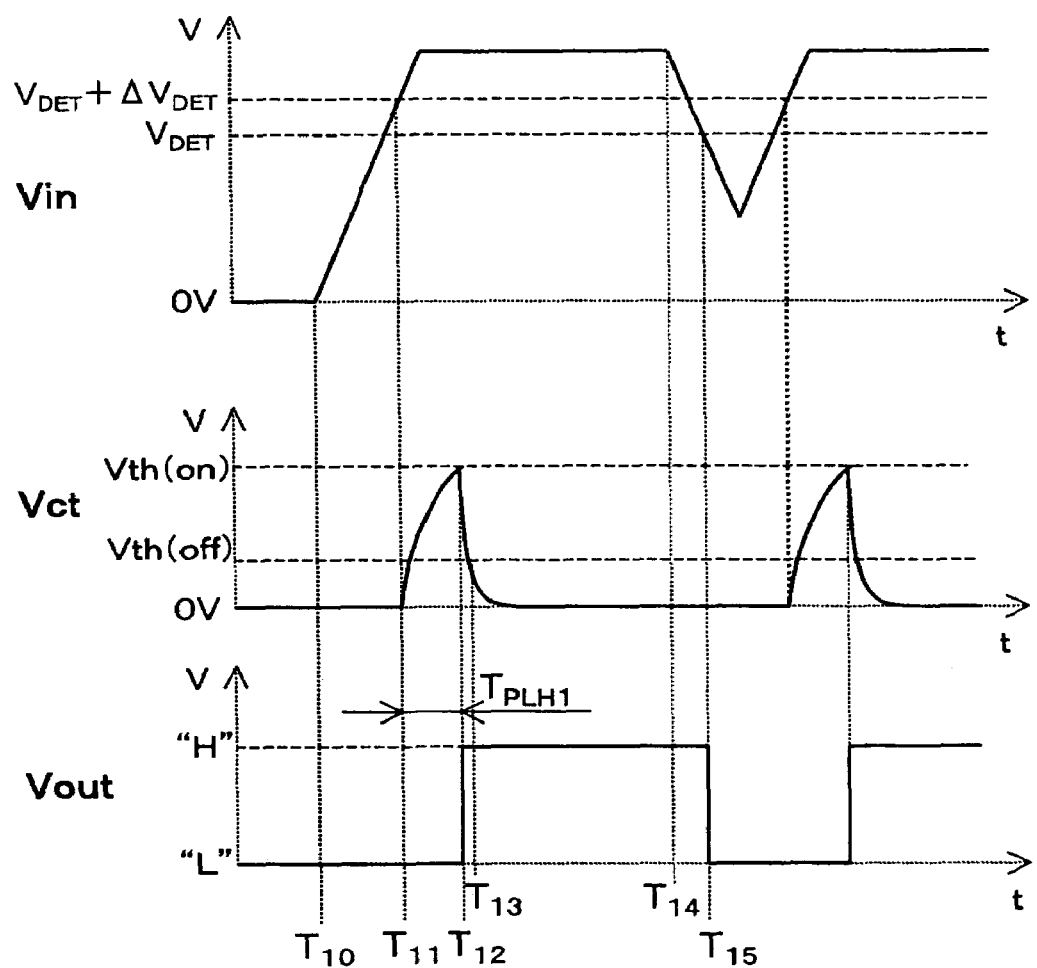
FIG. 5 A waveform diagram showing the voltage waveforms of the external terminals of the reset IC shown in FIGS. 2 and 3.

An operation of the reset IC 1 configured as described above will be described with reference to FIG. 5. FIG. 5 is a waveform diagram showing the voltage waveforms of the external terminals of the reset IC 1 shown in FIG. 2, that is, from top to bottom, a voltage waveform of an input voltage Vin to be applied to the input terminal 2, a voltage waveform of a terminal voltage Vct of the connection terminal CT, and a voltage waveform of an output signal Vout from the output terminal 3. In each of the voltage waveforms, the vertical axis represents voltage, and the horizontal axis represents time.

First, an operation performed when the input voltage Vin is swept up will be described. As shown in FIG. 5, at time $T_{10}$, the input voltage Vin starts to rise gradually, that is, to sweep up. The input voltage Vin is divided by the voltage division circuit 5 shown in FIG. 2, and the divided voltage from the voltage division circuit 5 is fed to the inverting input terminal (−) of the comparator 11. The comparator 11 compares the divided voltage with a reference voltage Vref from the reference voltage generation circuit 7. When the divided voltage is lower than the reference voltage Vref, that is, when the input voltage Vin is lower than the non-reset voltage $V_{DET}+\Delta V_{DET}$, the output of the comparator 11 turns to "H", and one input terminal of the NAND gate 19 turns to "L" via the inverter 16. Then, the output of the NAND gate 19 turns to "H" regardless of the state of the other input terminal thereof, whereby the MOS transistor 12 turns on, and the potential of the drain of the MOS transistor 12 becomes equal to the potential of the ground GND. This means that the capacitor C is in a discharged state, and the terminal voltage Vct of the connection terminal CT is 0 V. At this time, the reset input of the D latch 22 turns to "H", putting the D latch 22 into a reset state, and turning the output terminal (Q) thereof to "L". Accordingly, the output signal Vout of the output voltage terminal 3 takes "L" via the NAND gate 23 and the inverter 24.

At time $T_{11}$, at which the input voltage Vin reaches the non-reset voltage $V_{DET}+\Delta V_{DET}$, the divided voltage from the voltage division circuit 5 exceeds the reference voltage Vref. As a result, the output of the comparator 11 turns to "L", the input terminals of the NAND gate 19 turn to "H", the output of the NAND gate 19 turns to "L", the MOS transistor 12 turns off, and thus the capacitor C starts to be charged with a charging current flowing from the electric power supply Vdd and being limited by the charging resistance R. Accordingly, the terminal voltage Vct of the connection terminal CT rises according to a time constant determined by a resistance value of the charging resistance R and the capacitance of the capacitor C.

Figure 8:
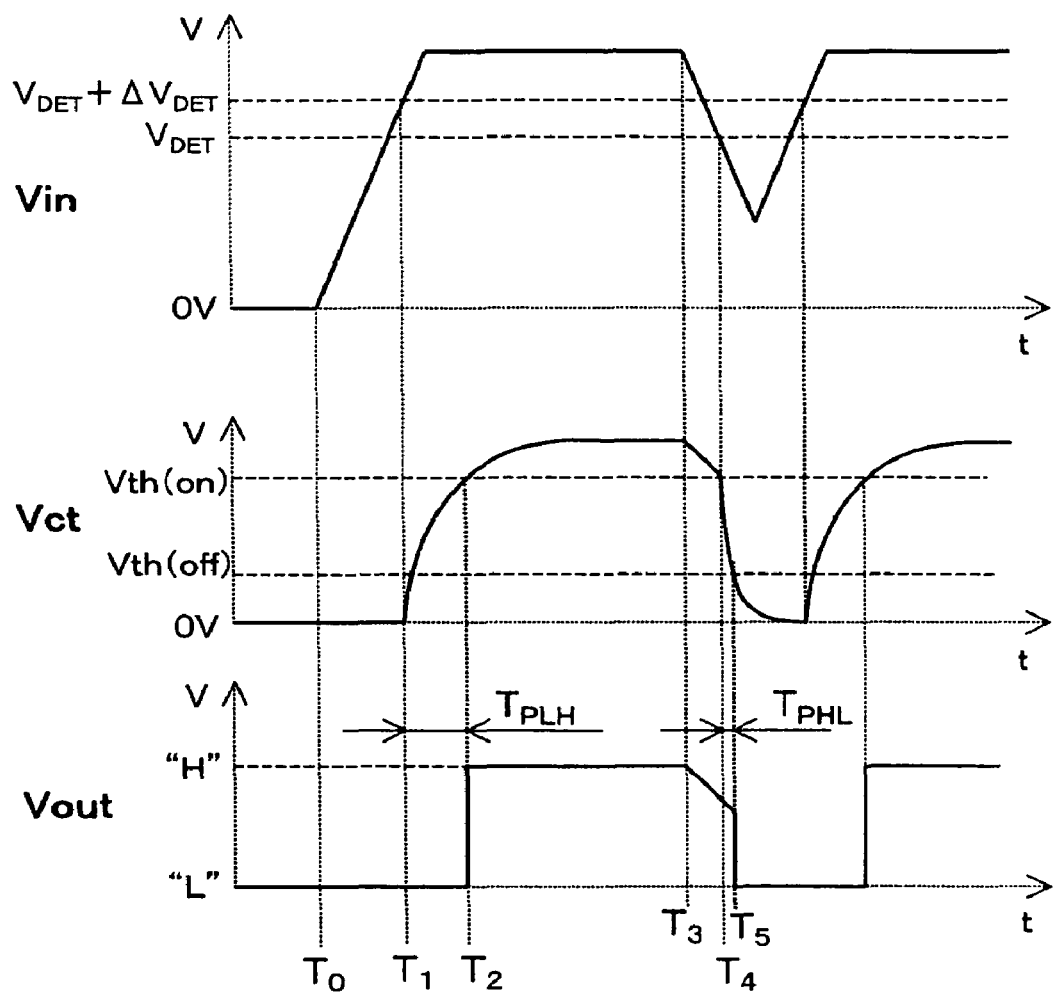
FIG. 8 A waveform diagram showing the voltage waveforms of the external terminals of the reset IC shown in FIG. 7.

At time $T_{12}$ at which the terminal voltage Vct exceeds a threshold voltage Vth (on) of the amplifier 13, the output of the amplifier 13 is inverted from "L" to "H". The resultant "H" signal is inputted to one input terminal of the NAND gate 21 via the inverter 20, whereby the output of the NAND gate 21, that is, the clock input of the D latch 22 turns to "H", and the output of the output terminal (Q) of the D latch 22 turns to "H". As a result, the input terminals of the NAND gate 23 turn to "H", and thus the output signal Vout is switched from "L" to "H". Here, as with the delay time $T_{PLH}$ shown in FIG. 8, the time difference between time $T_{11}$ and time $T_{12}$ corresponds to a delay time $T_{PLH1}$ with which the output signal Vout is switched from "L" to "H" when the input voltage Vin has risen. This delay time $T_{PLH1}$ can be set at an arbitrary time by replacing the capacitor C with a capacitor of different capacitance.

When the output signal Vout turns to "H", one input terminal of the NAND gate 19 turns to "L" via the inverter 25. As a result, the output of the NAND gate 19 turns to "H" regardless of the state of the other input terminal thereof, and thus the MOS transistor 12 turns on. Then, the potential of the drain of the MOS transistor 12 becomes equal to the potential of the ground GND, and thus the capacitor C starts to discharge. At time $T_{13}$ at which the terminal voltage Vct of the connection terminal CT becomes lower than a threshold voltage Vth (off), the output of the amplifier 13 is inverted from "H" to "L". Even then, the clock input of the D latch 22 remains "H" and the output terminal (Q) thereof remains "H", and thus the output signal Vout remains "H". At this time, since the MOS transistor 12 has turned on, making the input terminal of the amplifier 13 have a low impedance, the amplifier 13 can be prevented from malfunctioning even when suffering from intrusion of noise or the like from the direct-current power supply Vdd.

Next, an operation performed when the input voltage Vin is swept down will be described. As shown in FIG. 5, at time $T_{14}$, the input voltage Vin starts to decrease gradually, that is, to sweep down. When the input voltage Vin is higher than the reset detection voltage $V_{DET}$, the input terminals of the NAND gate 23 take "H", the output thereof takes "L", and the output signal Vout via the inverter 24 takes "H". When the input voltage Vin is swept down from that state and becomes lower than the reset detection voltage $V_{DET}$ at time $T_{15}$, the divided voltage from the voltage division circuit 5 becomes lower than the reference voltage Vref. As a result, the output of the comparator 11 turns to "H". The resultant "H" signal is inputted to the reset terminal of the D latch 22 via the inverters 16 and 27, and this "H" reset input resets the D latch 22, and thus the output terminal (Q) turns to "L". On the other hand, the "H" signal outputted from the comparator 11 is inputted to one input terminal of the NAND gate 23 via the inverters 16, 27, and 28, and thus the output of the NAND gate 23 turns to "H". As a result, the output signal Vout via the inverter 24 is switched from "H" to "L". At this time, there is no delay time corresponding to the delay time $T_{PHL}$ shown in FIG. 8 with which the output signal Vout is switched from "H" to "L" when the input voltage Vin has dropped, and therefore the output signal Vout is switched immediately from "H" to "L".

As described above, the reset IC 1 shown in FIG. 2 switches the output signal Vout from "L" to "H" after delaying it by a delay time corresponding to the capacitance of the capacitor C when the input voltage Vin has risen, whereas it switches the output signal Vout from "H" to "L" immediately when the input voltage Vin has dropped. Therefore, this reset IC 1 is permitted to monitor a power supply voltage to be fed to the electronic appliance in which the reset IC 1 is incorporated, and switch, by using the output signal Vout thereof, the control portion provided inside the electronic appliance between a reset state and a non-reset state in such a way that, when the power supply voltage to be fed to the electric appliance rises, the control portion is put into a non-reset state after a delay time has elapsed after the power supply voltage became higher than a predetermined voltage; whereas, when the power supply voltage decreases, the control portion is put into a reset state immediately when the power supply voltage becomes lower than a predetermined voltage.

Figure 3:
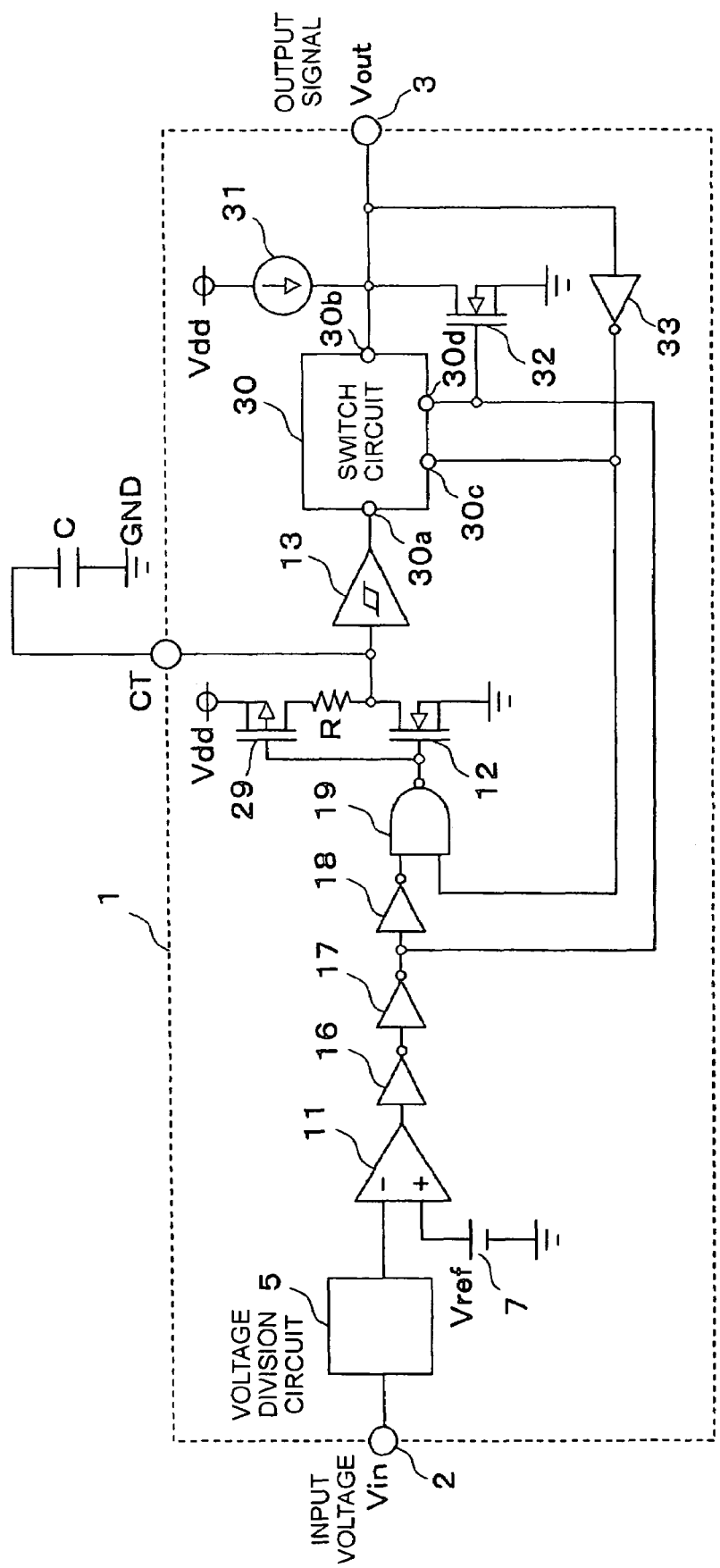
FIG. 3 A circuit diagram showing another example of the specific circuitry of the reset IC shown in FIG. 1.

FIG. 3 is a circuit diagram showing another example of the specific circuitry of the reset IC 1 shown in FIG. 1. In FIG. 3, such components as are found also in FIG. 2 will be identified with the same reference numerals and characters, and description thereof will not be repeated. The reset IC 1 shown in FIG. 3 differs from the reset IC 1 shown in FIG. 2 in that it is provided with a P-channel MOS transistor (switch) 29 between the electric power supply Vdd and the charging resistance R, a switch circuit (retention circuit) 30 as a retention circuit instead of the D latch 22 shown in FIG. 2, and a constant-current power supply (driver) 31 and an N-channel MOS transistor (driver) 32 as a driver for feeding a predetermined voltage to the output signal Vout. Moreover, the output of the inverter 16 is connected to one of the two input terminals of the NAND gate 19 via the inverters 17 and 18.

First, the source of the MOS transistor 29 is connected to the electric power supply Vdd, the drain thereof is connected to one end of the charging resistance R, and the gate thereof is connected to the gate of the MOS transistor 12 and to the output terminal of the NAND gate 19. With this configuration, when the output of the NAND gate 19 takes "L", the MOS transistor 29 turns on, and the MOS transistor 12 turns off. As a result, a charging current flows from the electric power supply Vdd to the capacitor C through the charging resistance R and the connection terminal CT, thereby charging the capacitor. On the other hand, when the output of the NAND gate 19 takes "H", the MOS transistor 12 turns on, thereby discharging the capacitor C via the connection terminal CT. At this time, the MOS transistor 29 turns off, whereby the current stops flowing from the electric power supply Vdd to the ground GND through the charging resistance R and the MOS transistor 12 that has turned on. Specifically, when the capacitor C is discharged, it is possible to prevent a current from unnecessarily flowing from the electric power supply Vdd through the charging resistance R, making it possible to reduce the electric power consumption of the reset IC 1. Note that the MOS transistor 29 can be provided in the reset IC 1 shown in FIG. 2.

Next, a switch circuit 30 will be described. The switch circuit 30 can be configured as shown in FIG. 4, for example.

Figure 4:
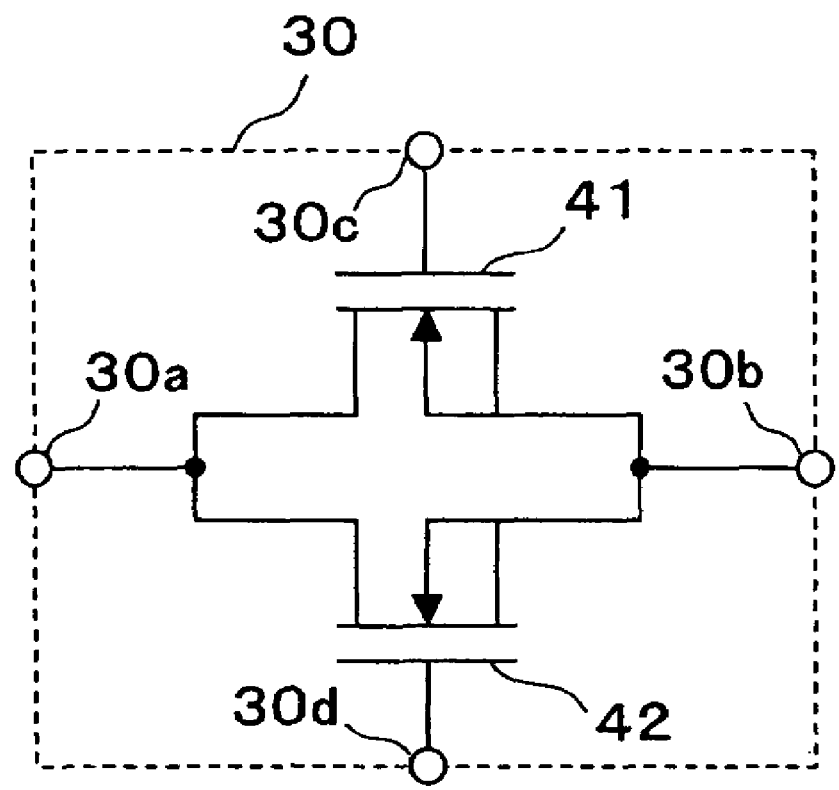
FIG. 4 A circuit diagram showing the internal circuitry of the switch circuit shown in FIG. 3.

FIG. 4 is a circuit diagram showing the inner circuitry of the switch circuit 30. The switch circuit 30 has inside N-channel MOS transistors (switches) 41 and 42, each having the drain connected to a terminal 30a, and having the source connected to a terminal 30b. Moreover, the gate of the MOS transistor 41 is connected to a control terminal 30c, and the gate of the MOS transistor 42 is connected to a control terminal 30d. When a "H" signal is inputted to the control terminal 30c and/or 30d, the switch circuit 30 configured as described above connects the terminals 30a and 30b together with a low resistance. On the other hand, when an "L" signal is inputted to the control terminals 30c and 30d, it disconnects the terminals 30a and 30b from each other.

In the reset IC 1 shown in FIG. 3, the terminal 30a of the switch circuit 30 is connected to the output terminal of the amplifier 13, and the terminal 30b thereof is connected to the output terminal 3. Moreover, the input terminal of the constant-current power supply 31 is connected to the electric power supply Vdd, and the output terminal thereof is connected to the drain of the MOS transistor 32 and to the output terminal 3. The source of the MOS transistor 32 is connected to the ground GND, and the gate thereof is connected to the control terminal 30d of the switch circuit 30 and to the output terminal of the inverter 17. Moreover, the output terminal 3 is connected, via the inverter 33, to the control terminal 30c of the switch circuit 30 and to the other input terminal of the NAND gate 19.

An operation of the reset IC 1 shown in FIG. 3 configured as described above will be described with reference again to FIG. 5. First, an operation performed when the input voltage Vin is swept up will be described. As shown in FIG. 5, at $T_{10}$, the input voltage Vin starts to rise gradually, that is, to sweep up. The input voltage Vin is divided by the voltage division circuit 5 shown in FIG. 3, and the divided voltage from the voltage division circuit 5 is fed to the inverting input terminal (−) of the comparator 11. The comparator 11 compares the divided voltage with a reference voltage Vref from the reference voltage generation circuit 7. When the input voltage Vin is lower than the non-reset voltage $V_{DET}+\Delta V_{DET}$, the output of the comparator 11 turns to "H", and one input terminal of the NAND gate 19 turns to "L" via the inverters 16, 17, and 18. Then, the output of the NAND gate 19 turns to "H" regardless of the state of the other input terminal thereof, whereby the MOS transistor 12 turns on, and the potential of the drain of the MOS transistor 12 becomes equal to the potential of the ground GND. This means that the capacitor C is in a discharged state, and the terminal voltage Vct of the connection terminal CT is 0 V. As described earlier, at this time, the MOS transistor 29 turns off, thereby preventing a current from unnecessarily flowing from the electric power supply Vdd to the ground GND through the charging resistance R and the MOS transistor 12 that has turned on. Moreover, at this time, the output signal Vout takes "L" since the MOS transistor 32 has turned on in response to "H" inputted to the gate thereof. Furthermore, the switch circuit 30 receives, at the control terminals 30c and 30d thereof, an "H" signal, and thus the terminals 30a and 30b are connected together.

At time $T_{11}$ at which the input voltage Vin reaches the non-reset voltage $V_{DET}+\Delta V_{DET}$, the divided voltage from the voltage division circuit 5 exceeds the reference voltage Vref, and thus the output of the comparator 11 turns to "L". Then, the two input terminals of the NAND gate 19 turn to "H", the output of the NAND gate 19 turns to "L", the MOS transistor 12 turns off, the MOS transistor 29 turns on, and thus the capacitor C starts to be charged with a charging current flowing from the electric power supply Vdd and being limited by the charging resistance R. Accordingly, the terminal voltage Vct of the connection terminal CT rises according to a time constant determined by a resistance value of the charging resistance R and the capacitance of the capacitor C. At this time, the gate input of the MOS transistor 32 takes "L", and thus the MOS transistor 32 turns off. Even then, since the input of the control terminal 30c remains "H", the terminals 30a and 30b of the switch circuit 30 are connected together. Also, the output terminal of the amplifier 13 takes "L", whereby the output signal Vout remains "L".

At time $T_{12}$ at which the terminal voltage Vct exceeds a threshold voltage Vth (on) of the amplifier 13, the output of the amplifier 13 is inverted from "L" to "H", and thus the output signal Vout via the switch circuit 30 is switched from "L" to "H". Then, the input of the control terminal 30c of the switch circuit 30 turns to "L", and thus the terminals 30a and 30b are disconnected from each other. As a result, the output signal Vout is kept at "H" regardless of the state of the output terminal of the amplifier 13. Here, as with the delay time $T_{PLH}$ shown in FIG. 8, the time difference between time $T_{11}$ and $T_{12}$ corresponds to a delay time $T_{PLH1}$ with which the output signal Vout is switched from "L" to "H" when the input voltage Vin has risen. This delay time $T_{PLH1}$ can be set at an arbitrary time by replacing the capacitor C with a capacitor of different capacitance.

When the output signal Vout turns to "H", one input terminal of the NAND gate 19 turns to "L" via the inverter 33. As a result, the output of the NAND gate 19 turns to "H" regardless of the state of the other input terminal thereof, the MOS transistor 12 turns on, the potential of the drain of the MOS transistor 12 becomes equal to the potential of the ground GND, and thus the capacitor C starts to discharge. As described earlier, at this time, the MOS transistor 29 turns off, thereby preventing a current from unnecessarily flowing from the electric power supply Vdd to the ground GND through the charging resistance R and the MOS transistor 12 that has turned on. As described above, the MOS transistor 29 turns off, and is then cut off from the direct-current power supply Vdd, making it possible to prevent intrusion of noise or the like from the direct-current power supply Vdd. Furthermore, the MOS transistor 12 turns on, and thus the input terminal of the amplifier 13 has a low impedance, making it possible to prevent the amplifier 13 from malfunctioning. At time $T_{13}$ at which the terminal voltage Vct of the connection terminal CT becomes lower than a threshold voltage Vth (off), the output of the amplifier 13 is inverted from "H" to "L". Even then, since the terminals 30a and 30b of the switch circuit 30 have already been disconnected from each other, the output signal Vout remains "H".

Next, an operation performed when the input voltage Vin is swept down will be described. As shown in FIG. 5, at time $T_{14}$, the input voltage Vin starts to decrease gradually, that is, to sweep down. As described earlier, when the input voltage Vin is higher than the reset detection voltage $V_{DET}$, the output signal Vout takes "H". When the input voltage Vin is swept down from that state and becomes lower than the reset detection voltage $V_{DET}$ at time $T_{15}$, the divided voltage from the voltage division circuit 5 becomes lower than the reference voltage Vref. As a result, the output of the comparator 11 turns to "H", and the output thereof via the inverters 16 and 17 turns to "H". Then, the control terminal 30d of the switch circuit 30 turns to "H", whereby the terminals 30a and 30b are connected together, the MOS transistor 32 turns on, and thus the output signal Vout is switched from "H" to "L". At this time, there is no delay time corresponding to the delay time $T_{PHL}$ shown in FIG. 8 with which the output signal Vout is switched from "H" to "L" when the input voltage Vin has dropped, and therefore the output signal Vout is switched immediately from "H" to As described above, the reset IC 1 shown in FIG. 3 switches the output signal Vout from "L" to "H" after delaying it by a delay time corresponding to the capacitance of the capacitor C when the input voltage Vin has risen, whereas it switches the output signal Vout from "H" to "L" immediately when the input voltage Vin has dropped. Moreover, the reset IC 1 shown in FIG. 3 has a simple circuit configuration. This decreases the number of parts, making the reset IC 1 smaller. This makes it easier to incorporate the reset IC 1 into an electronic appliance or the like.

Moreover, in the reset IC 1 shown in FIGS. 2 and 3, the input voltage Vin may be used in place of the direct-current power supply Vdd. This eliminates the need for the direct-current power supply Vdd, making it possible to further simplify the reset IC 1.

Furthermore, the embodiment described just above deals with a case where, when the input voltage Vin has risen above the non-reset voltage $V_{DET}+\Delta V_{DET}$, the output signal Vout is switched from "L" to "H", and, when the input voltage Vin has dropped below the reset detection voltage $V_{DET}$, the output signal Vout is switched from "H" to "L". It should be understood, however, that the circuit may be so modified as to output the output signal Vout with the inverted logic levels. Moreover, this embodiment deals with a case in which a NAND gate is used as a logic gate for driving the MOS transistor 12 that serves as a switch for charging/discharging the capacitor C. It should be understood, however, a similar logic gate can be configured by using a different gate element.

Figure 6:
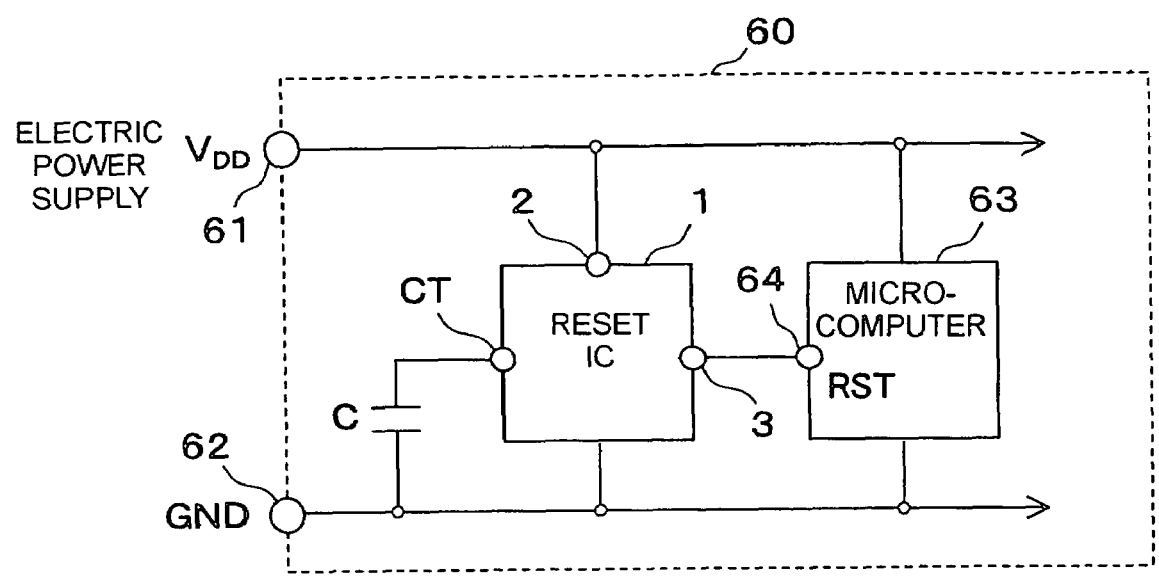
FIG. 6 A block diagram showing the electrical configuration of the electronic appliance in which the power supply monitor system of one embodiment of the present invention is incorporated.

Next, a power supply monitor system employing the reset IC described above will be described. FIG. 6 is a block diagram showing the electric configuration of the electronic appliance in which the power supply monitor system of one embodiment of the present invention is incorporated. In FIG. 6, such components as are found also in FIG. 1 will be identified with the same reference numerals and characters, and description thereof will not be repeated. In FIG. 6, reference numeral 60 denotes an electronic appliance that operates on a power supply voltage $V_{DD}$ fed between a power supply terminal 61 and a ground (GND) terminal 62. Moreover, reference numeral 63 denotes a microcomputer (control portion) that controls the electronic appliance 60 and operates on the power supply voltage $V_{DD}$ fed thereto. Note that the microcomputer 63 may operate on a different electric power supply provided inside the electronic appliance 60 instead of the power supply voltage $V_{DD}$. Moreover, the control portion of the electronic appliance 60 is not limited to the microcomputer, but may be a DSP or a logic circuit.

Moreover, the electronic appliance 60 includes the reset IC 1 described above, the input terminal 2 of the reset IC 1 is connected to the power supply terminal 61, and the connection terminal CT is connected to the GND terminal 62 via the capacitor C. The output terminal 3 of the reset IC 1 is connected to a reset (RST) terminal 64 of the microcomputer 63, and the ground of the reset IC 1 is connected to the GND terminal 62. This reset IC 1 operates on the power supply voltage $V_{DD}$; in practice, however, it may be so configured as to receive an operating electric power supply separately.

Next, an operation of the power supply monitor system configured as described above will be described. When the power supply voltage $V_{DD}$ becomes higher than a non-reset voltage $V_{DET}+\Delta V_{DET}$ that has been previously set for the reset IC 1, the reset IC 1 switches, as described earlier, the voltage of the output terminal 3 from "L" to "H" with a predetermined delay time $T_{PLH1}$ determined by the capacitance of the capacitor C. Then, the microcomputer 63 that has received an "H" voltage at the RST terminal 64 thereof is unreset, and thus performs control of the electronic appliance 60. This permits the electronic appliance 60 to obtain a stable power supply voltage $V_{DD}$, and thus operate normally.

On the other hand, when the power supply voltage $V_{DD}$ becomes lower than the reset detection voltage $V_{DET}$ that has been previously set for the reset IC 1, the reset IC 1 switches, as described earlier, the voltage of the output terminal 3 immediately from "H" to "L". Then, the microcomputer 63 that has received an "L" voltage at the RST terminal 64 thereof shifts into a reset state, and thus stops controlling the electronic appliance 60. This permits the electronic appliance 60 to stop immediately without running out of control or malfunctioning due to lack of voltage from the power supply voltage $V_{DD}$. Moreover, it is possible to switch the microcomputer 63 between a reset state and a non-reset state so as to handle frequency variations in the power supply voltage $V_{DD}$ by immediately switching the voltage of the output terminal 3.

With such a power supply monitor system, the microcomputer 63 that serves as a control portion of the electronic appliance 60 is switched into a non-reset state with a predetermined delay time when a power supply voltage $V_{DD}$ has risen, making it possible to make the electronic appliance 60 operate on a stable power supply voltage $V_{DD}$, whereas the microcomputer 63 that serves as a control portion of the electronic appliance 60 is switched into a reset state immediately when the power supply voltage $V_{DD}$ has dropped below a predetermined voltage, making it possible to prevent the electronic appliance 60 from running out of control or malfunctioning. Moreover, this system can be used as a power supply voltage monitor system that offers improved response to the frequency variations in the power supply voltage $V_{DD}$.

It is to be understood that the present invention may be carried out in any other manner than specifically described above as an embodiment, and many modifications and variations are possible within the scope of the invention.

INDUSTRIAL APPLICABILITY

According to the present invention, it is possible to realize a semiconductor integrated circuit device that can switch a monitor signal to be outputted from a second voltage to a first voltage after delaying it by a delay time corresponding to the capacitance of a capacitor when an input voltage has risen, and that can switch the monitor signal from a first voltage to a second voltage immediately when the input voltage has dropped. This semiconductor integrated circuit device is incorporated in an electronic appliance having a control portion such as a microcomputer, a DSP, or a logic circuit, and used as a voltage detection device that monitors a power supply voltage to be fed to the electronic appliance and detects a set voltage. This makes it possible to make the electronic appliance operate on a stable power supply voltage by switching an output signal by a predetermined delay time when it is detected that the power supply voltage has risen, and prevent the electronic appliance from running out of control or malfunctioning by switching the output signal immediately when it is detected that the power supply voltage has dropped.

The invention claimed is:

1. A semiconductor integrated circuit device that monitors an input voltage by comparing the input voltage with a predetermined voltage, and outputs a voltage representing a result of comparison, the semiconductor integrated circuit device comprising:
    a detection circuit to detect that the input voltage has risen by comparing the input voltage with a reference voltage, and to output a detection signal of the input voltage;
    a delay circuit to delay the detection signal from the detection circuit by a time constant adjustment method;
    a connection terminal to which a capacitor is connected;
    a retention circuit to receive an output of the detection circuit and an output of the delay circuit, and to retain the detection signal delayed by the delay circuit, and
    a driver to generate a first voltage according to the detection signal retained by the retention circuit and to inhibit an output of the detection signal immediately when the detection circuit detects that the input voltage has dropped,
    wherein the delay circuit is arranged to delay the detection signal from the detection circuit by charging the capacitor via the connection terminal, and to discharge the capacitor by outputting the detection signal,
    wherein the delay circuit includes:
        a charging resistance connected between a direct-current power supply and the connection terminal,
        a first switch connected between the connection terminal and ground,
        a logic gate to turn off the first switch when the detection signal from the detection circuit and the monitor signal of a second voltage are fed thereto, and
        an amplifier to output a high level or low level signal according to a voltage of the connection terminal,
    wherein the semiconductor integrated circuit device is arranged to provide, as an output monitor signal, a voltage generated by the driver.

2. The semiconductor integrated circuit device of claim 1, wherein the delay circuit includes a second switch connected between the direct-current power supply and the charging resistance, the second switch operable to perform a reverse on/off operation of the first switch.

3. The semiconductor integrated circuit device of claim 1, wherein the retention circuit is a D latch that is set when the detection signal delayed by the delay circuit is fed thereto as a clock input, and is reset when the detection circuit detects that the input voltage has dropped.

4. The semiconductor integrated circuit device of claim 1, wherein the retention circuit is a switch circuit that connects and disconnects the delay circuit to and from the driver according to an output of the detection circuit and the monitor signal.

5. The semiconductor integrated circuit device of claim 4, wherein the switch circuit comprises a third switch that turns on when the monitor signal is the first voltage and a fourth switch that turns on when the detection signal from the detection circuit is fed thereto, the third and fourth switches being connected in parallel between the delay circuit and the driver.

6. A power supply voltage monitor system comprising:
    the semiconductor integrated circuit device of claim 1;
    wherein the power supply voltage monitor system causes the semiconductor integrated circuit device to:
    monitor a power supply voltage to be fed to an electronic appliance, and
    switch a control portion of the electronic appliance between a reset state and a non-reset state according to the monitor signal from the semiconductor integrated circuit device.

7. A power supply voltage monitor system comprising:
    the semiconductor integrated circuit device of claim 3;
    wherein the power supply voltage monitor system causes the semiconductor integrated circuit device to:
        monitor a power supply voltage to be fed to an electronic appliance, and
        switch a control portion of the electronic appliance between a reset state and a non-reset state according to the monitor signal from the semiconductor integrated circuit device.

8. A power supply voltage monitor system comprising:
    the semiconductor integrated circuit device of claim 4;
    wherein the power supply voltage monitor system causes the semiconductor integrated circuit device to:
        monitor a power supply voltage to be fed to an electronic appliance, and
        switch a control portion of the electronic appliance between a reset state and a non-reset state according to the monitor signal from the semiconductor integrated circuit device.

9. A power supply voltage monitor system comprising:
    the semiconductor integrated circuit device of claim 5; and
    wherein the power supply voltage monitor system causes the semiconductor integrated circuit device to:
        monitor a power supply voltage to be fed to an electronic appliance, and
        switch a control portion of the electronic appliance between a reset state and a non-reset state according to the monitor signal from the semiconductor integrated circuit device.

* * * * *